United States Patent
Baba et al.

(10) Patent No.: US 11,708,816 B2
(45) Date of Patent: Jul. 25, 2023

(54) CONDITION MONITORING DEVICE AND CONDITION MONITORING METHOD FOR WIND TURBINE POWER GENERATING APPARATUS

(71) Applicants: MITSUBISHI HEAVY INDUSTRIES, LTD., Tokyo (JP); MITSUBISHI POWER, LTD., Yokohama (JP)

(72) Inventors: Mitsuya Baba, Tokyo (JP); Yasushi Morishita, Yokohama (JP); Minoru Sugiura, Yokohama (JP); Kazuhiro Tsuyuki, Yokohama (JP); Hideru Sakata, Yokohama (JP)

(73) Assignee: MITSUBISHI HEAVY INDUSTRIES, LTD., Tokyo (JP)

( * ) Notice: Subject to any disclaimer, the term of this patent is extended or adjusted under 35 U.S.C. 154(b) by 65 days.

(21) Appl. No.: 17/241,214

(22) Filed: Apr. 27, 2021

(65) Prior Publication Data
US 2021/0332797 A1    Oct. 28, 2021

(30) Foreign Application Priority Data
Apr. 28, 2020    (JP) .................... 2020-079138

(51) Int. Cl.
*F03D 17/00*    (2016.01)
*F03D 9/25*    (2016.01)
(Continued)

(52) U.S. Cl.
CPC ............. *F03D 17/00* (2016.05); *F03D 9/25* (2016.05); *G01R 19/00* (2013.01);
(Continued)

(58) Field of Classification Search
CPC .......... F03D 17/00; F03D 9/25; F03D 7/0224; F03D 7/0264; G01R 19/00;
(Continued)

(56) References Cited

U.S. PATENT DOCUMENTS

2017/0145989 A1* 5/2017 Ritter .................... F03D 7/0284
2019/0010924 A1* 1/2019 Theopold .............. F03D 7/0224

FOREIGN PATENT DOCUMENTS

JP    5733913 B2    6/2015
KR    20060061141    *    6/2006    ................ H02P 8/40
(Continued)

OTHER PUBLICATIONS

English translation for WO-2018109993-A1 (Year:2018).*
English translation for KR-20060061141 A (Year:2006).*
English translation for WO-2018158910-A1 (Year:2018).*

*Primary Examiner* — Lee E Rodak
*Assistant Examiner* — Byung Ro Lee
(74) *Attorney, Agent, or Firm* — Kanesaka Berner and Partners LLP

(57) ABSTRACT

A condition monitoring device for a wind turbine power generating apparatus provided with an auxiliary motor power supply system including a power-supply-side line connected to a power supply and a plurality of auxiliary-motor-side lines diverging from the power-supply-side line and connected to a plurality of auxiliary motors, respectively, comprises: a current measurement device for measuring a current flowing through the power-supply-side line; and a control device for controlling the plurality of auxiliary motors. The control device is configured to, when a generator of the wind turbine power generating apparatus is in a standby state where power generation is stopped at a low wind speed, execute a single sequential operation mode in which each of the plurality of auxiliary motors is singly and sequentially operated. The current measurement device is configured to measure a current flowing through the power-supply-side line during execution of the single sequential operation mode by the control device.

16 Claims, 8 Drawing Sheets

(51) Int. Cl.
*G01R 19/00* (2006.01)
*G01R 19/30* (2006.01)
*G01R 21/06* (2006.01)

(52) U.S. Cl.
CPC ......... *G01R 19/0092* (2013.01); *G01R 19/30* (2013.01); *G01R 21/06* (2013.01); *F05B 2220/7064* (2013.01); *F05B 2260/80* (2013.01); *F05B 2270/32* (2013.01); *F05B 2270/342* (2020.08); *F05B 2270/803* (2013.01)

(58) Field of Classification Search
CPC .... G01R 19/0092; G01R 19/30; G01R 21/06; F05B 2220/7064; F05B 2260/80; F05B 2270/32; F05B 2270/342; F05B 2270/803; Y02E 10/72
USPC ...................................................... 324/76.11
See application file for complete search history.

(56) References Cited

FOREIGN PATENT DOCUMENTS

| WO | WO-2018109993 A1 * | 6/2018 | ............. G01H 1/003 |
|---|---|---|---|
| WO | WO-2018158910 A1 * | 9/2018 | ............. G01M 99/00 |

\* cited by examiner

CONDITION MONITORING DEVICE AND CONDITION MONITORING METHOD FOR WIND TURBINE POWER GENERATING APPARATUS

RELATED APPLICATIONS

The present application claims priority of Japanese Application Number 2020-079138 filed Apr. 28, 2020, the disclosure of which is hereby incorporated by reference herein in its entirety.

TECHNICAL FIELD

The present disclosure relates to a condition monitoring device and a condition monitoring method for a wind turbine power generating apparatus.

BACKGROUND

Patent Document 1 discloses an abnormality diagnosis method for performing abnormality diagnosis of a rotary machine including a motor, based on a reference sinusoidal signal waveform of a rated current of the motor.

CITATION LIST

Patent Literature

Patent Document 1: JP5733913B

SUMMARY

The wind turbine power generating apparatus is provided with an auxiliary system including a plurality of auxiliary motors such as fan motors and pump motors and an auxiliary motor power supply system for supplying power to the plurality of auxiliary motors.

If a current measurement device is separately provided for each of the auxiliary motors in order to monitor the condition of the auxiliary system, the number of components of the device for monitoring the condition increases, so that the cost increases. Further, Patent Document 1 does not disclose specific knowledge regarding the condition monitoring of the auxiliary system of the wind turbine power generating apparatus.

In view of the above, an object of the present disclosure is to provide a condition monitoring device and a condition monitoring method for a wind turbine power generating apparatus whereby it is possible to monitor the condition of the auxiliary system of the wind turbine power generating apparatus with a small number of components.

To accomplish the above object, a condition monitoring device for a wind turbine power generating apparatus according to an embodiment of the present disclosure for monitoring a condition of an auxiliary system of the wind turbine power generating apparatus, the auxiliary system including a plurality of auxiliary motors and an auxiliary motor power supply system for supplying power to the plurality of auxiliary motors, the auxiliary motor power supply system including a power-supply-side line connected to a power supply and a plurality of auxiliary-motor-side lines diverging from the power-supply-side line and connected to the plurality of auxiliary motors respectively, comprises: a current measurement device for measuring a current flowing through the power-supply-side line; and a control device for controlling the plurality of auxiliary motors. The control device is configured to, when a generator of the wind turbine power generating apparatus is in a standby state where power generation is stopped at a low wind speed, execute a single sequential operation mode in which each of the plurality of auxiliary motors is singly and sequentially operated. The current measurement device is configured to measure a current flowing through the power-supply-side line during execution of the single sequential operation mode by the control device.

To accomplish the above object, a condition monitoring method for a wind turbine power generating apparatus according to an embodiment of the present disclosure for monitoring a condition of an auxiliary system of the wind turbine power generating apparatus, the auxiliary system including a plurality of auxiliary motors and an auxiliary motor power supply system for supplying power to the plurality of auxiliary motors, the auxiliary motor power supply system including a power-supply-side line connected to a power supply and a plurality of auxiliary-motor-side lines diverging from the power-supply-side line and connected to the plurality of auxiliary motors respectively, comprises: a step of, when a generator of the wind turbine power generating apparatus is in a standby state where power generation is stopped at a low wind speed, executing a single sequential operation mode in which each of the plurality of auxiliary motors is singly and sequentially operated; and a step of measuring a current flowing through the power-supply-side line during execution of the single sequential operation mode.

The present disclosure provides a condition monitoring device and a condition monitoring method for a wind turbine power generating apparatus whereby it is possible to monitor the condition of the auxiliary system of the wind turbine power generating apparatus with a small number of components.

DETAILED DESCRIPTION

Embodiments of the present disclosure will now be described in detail with reference to the accompanying drawings. It is intended, however, that unless particularly specified, dimensions, materials, shapes, relative positions and the like of components described in the embodiments shall be interpreted as illustrative only and not intended to limit the scope of the present invention.

For instance, an expression of relative or absolute arrangement such as "in a direction", "along a direction", "parallel", "orthogonal", "centered", "concentric" and "coaxial" shall not be construed as indicating only the arrangement in a strict literal sense, but also includes a state where the arrangement is relatively displaced by a tolerance, or by an angle or a distance whereby it is possible to achieve the same function.

For instance, an expression of an equal state such as "same" "equal" and "uniform" shall not be construed as indicating only the state in which the feature is strictly equal, but also includes a state in which there is a tolerance or a difference that can still achieve the same function.

Further, for instance, an expression of a shape such as a rectangular shape or a cylindrical shape shall not be construed as only the geometrically strict shape, but also includes a shape with unevenness or chamfered corners within the range in which the same effect can be achieved.

On the other hand, an expression such as "comprise", "include", "have", "contain" and "constitute" are not intended to be exclusive of other components.

Figure 1:
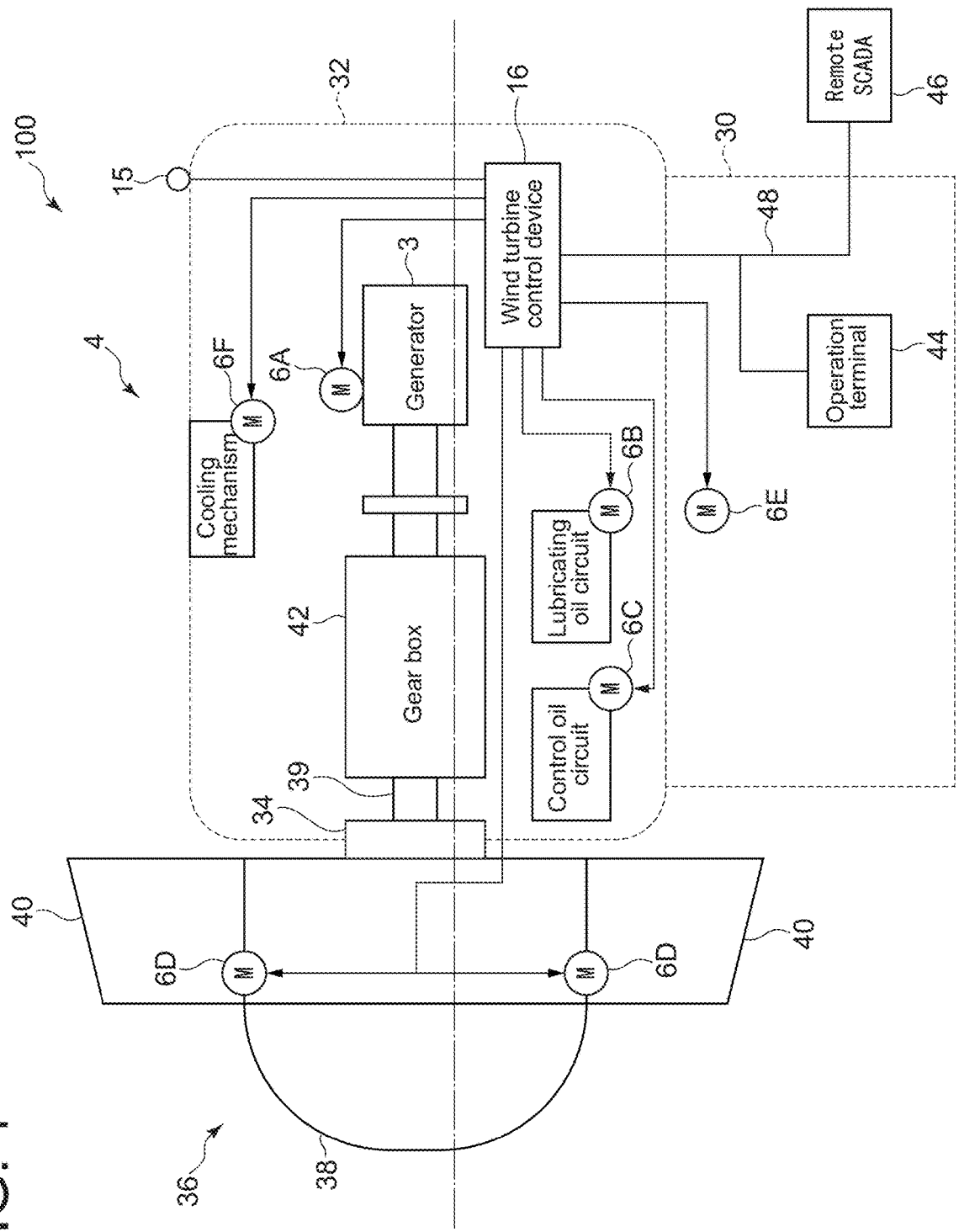
FIG. 1 is a schematic diagram showing a configuration example of a wind turbine power generating apparatus 100.

FIG. 1 is a schematic diagram showing a configuration example of a wind turbine power generating apparatus 100 (hereinafter, also referred to as "wind turbine") to be monitored by a condition monitoring device, which will be described later.

The wind turbine power generating apparatus 100 includes a tower 30, a nacelle 32 disposed on top of the tower 30, a wind turbine rotor 36 rotatably supported by a bearing 34 disposed on the nacelle 32, a generator 3 as a main machine accommodated in the nacelle 32, an auxiliary system 4, and a wind turbine control device 16.

The wind turbine rotor 36 includes a main shaft 39 rotatably supported by the bearing 34, a hub 38 connected to one end of the main shaft 39, and a plurality of wind turbine blades 40 attached to the outer peripheral side of the hub 38. The main shaft 39 is connected to the generator 3 via a gear box 42 so that rotational energy of the wind turbine rotor 36 is transmitted to the generator 3 via the gear box 42.

The auxiliary system 4 includes a plurality of auxiliary motors 6. Each auxiliary motor 6 is a motor that functions as an accessory device necessary for operating the generator 3 as the main machine. The plurality of auxiliary motors 6 includes, for example, a cooling fan motor 6A for cooling the inside of the generator 3, a lubricating oil pump motor 6B disposed on a lubricating oil circuit for supplying lubricating oil to at least one of the gear box 42 or the bearing 34, a control oil pump motor 6C disposed on a control oil circuit for supplying control oil to a device driven by the control oil, a pitch motor 6D for adjusting the pitch angle of the wind turbine blade 40, a yaw motor 6E for adjusting the yaw angle of the nacelle 32, and a cooling fan motor 6F used in a cooling mechanism for cooling devices which require cooling.

The wind turbine control device 16 is configured to control each of the plurality of auxiliary motors 6 (6A to 6F), and is configured to be able to communicate with an operation terminal 44 arranged in the tower 30 and a supervision control and data acquisition (SCADA) system 46 arranged separately from the wind turbine power generating apparatus 100 via a communication network 48.

Figure 2:
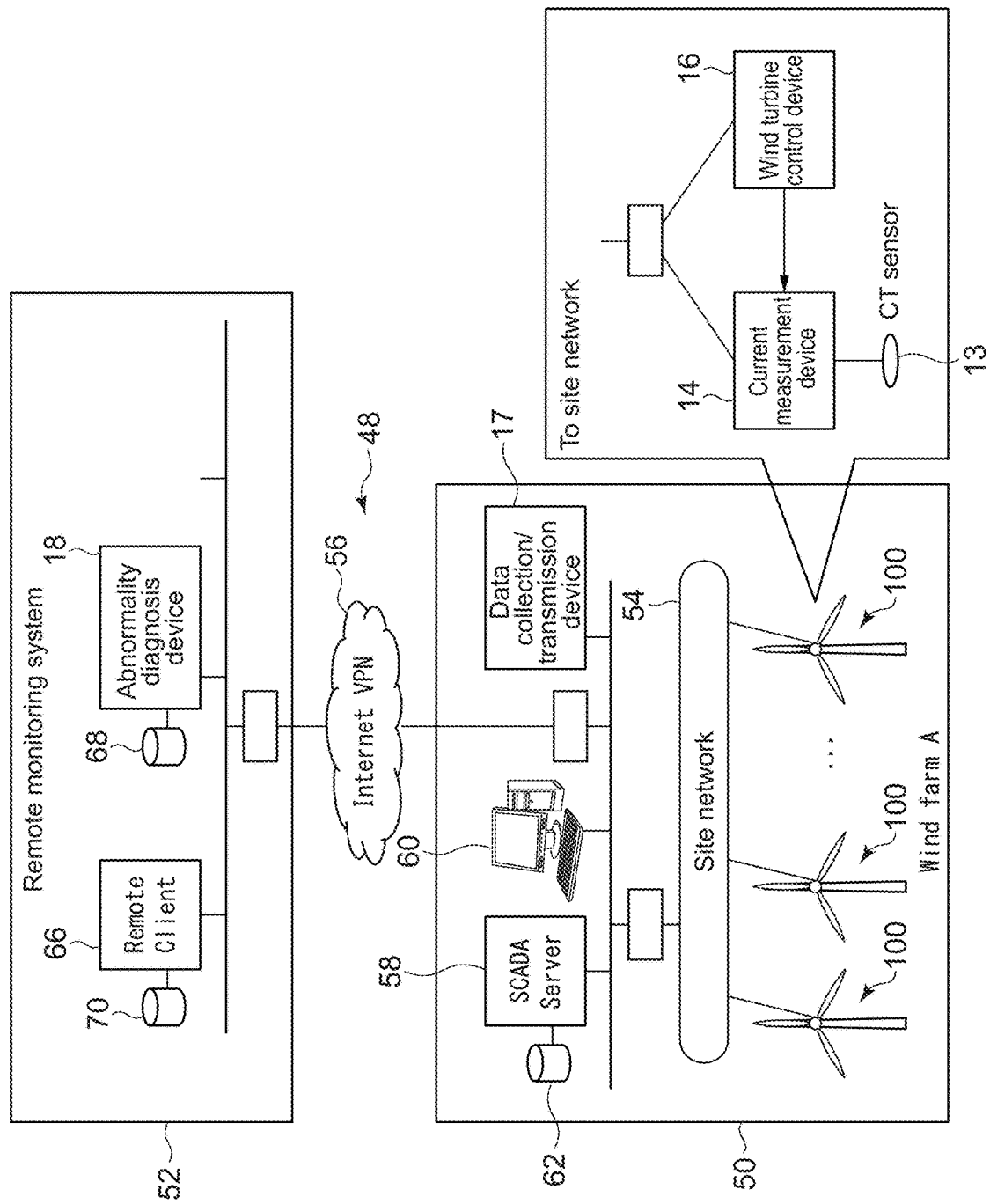
FIG. 2 is a schematic diagram showing a configuration example of a wind farm 50 including a plurality of wind turbine power generating apparatuses 100 and a configuration example of a remote monitoring system 52.

FIG. 2 is a schematic diagram showing a configuration example of a wind farm 50 including a plurality of wind turbine power generating apparatuses 100 and a configuration example of a remote monitoring system 52.

As shown in FIG. 2, the wind farm 50 includes a plurality of the above-described wind turbine power generating apparatuses 100, and each wind turbine power generating apparatus 100 is provided with the wind turbine control device 16 and a current measurement device 14 which will be described later. The wind turbine control device 16 and the current measurement device 14 are connected to the remote monitoring system 52 via the communication network 48.

In the exemplary embodiment shown in FIG. 2, the communication network 48 includes a site network 54 provided in the wind farm 50. The site network 54 is connected to the remote monitoring system 52 via an Internet virtual private network (VPN) 56.

The site network 54 is connected to a data collection/transmission device 17, a SCADA server 58, and a computer 60. The SCADA server 58 is connected to a storage device 62.

The remote monitoring system 52 includes an abnormality diagnosis device 18 and a remote client 66. The abnormality diagnosis device 18 is connected to a storage device 68, and the remote client 66 is connected to a storage device 70.

Figure 3:
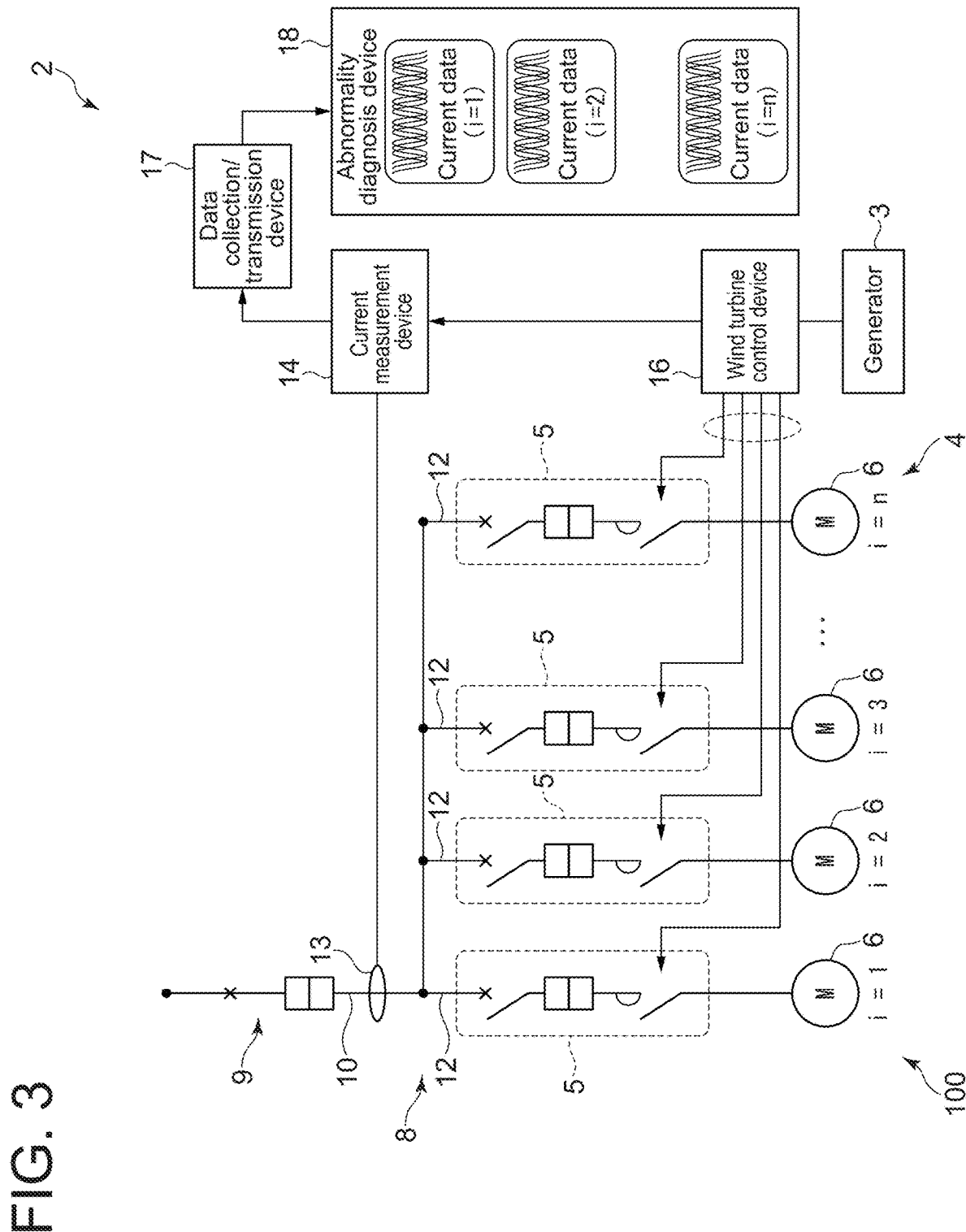
FIG. 3 is a schematic diagram showing a configuration example of a condition monitoring device 2 according to an embodiment.

FIG. 3 is a schematic diagram showing a configuration example of a condition monitoring device 2 according to an embodiment. The condition monitoring device 2 is a device for a wind turbine power generating apparatus and is configured to monitor the condition of the auxiliary system 4 of the above-described wind turbine power generating apparatus 100.

The auxiliary system 4 includes a plurality of the above-described auxiliary motors 6, and an auxiliary motor power supply system 8 for supplying power to the plurality of auxiliary motors 6. In the following, the plurality of auxiliary motors 6 will be described without distinguishing the type of the auxiliary motors 6 (cooling fan motor 6A, lubricating oil pump motor 6B, control oil pump motor 6C, pitch motor 6D, yaw motor 6E, cooling fan motor 6F). The plurality of auxiliary motors 6 may include an auxiliary motor other than the auxiliary motors 6A to 6F.

The auxiliary motor power supply system 8 includes a power-supply-side line 10 connected to a power supply (not shown) and a plurality of auxiliary-motor-side lines 12 diverging from the power-supply-side line 10 and connected to the plurality of auxiliary motors 6, respectively. The power-supply-side line 10 is provided with a breaker 9, and each of the auxiliary-motor-side lines 12 is provided with a contactor 5.

The condition monitoring device 2 includes a current transducer (CT) sensor 13 as a current sensor disposed on the power-supply-side line 10, the current measurement device 14 configured to measure a current flowing through the power-supply-side line 10 based on the output of the CT sensor 13, the wind turbine control device 16 for controlling the plurality of auxiliary motors 6, the data collection/transmission device 17, and the abnormality diagnosis device 18.

The wind turbine control device 16 is configured to, when the generator 3 of the wind turbine power generating apparatus 100 is in a standby state where power generation is stopped at a low wind speed, execute a single sequential operation mode in which each of the plurality of auxiliary motors 6 is singly and sequentially operated. In the illustrated exemplary embodiment, the wind turbine control device 16 controls each of the auxiliary motors 6 by controlling the opening and closing of each of the contactors 5. The "standby state where power generation is stopped at a low wind speed" means that power generation by the generator 3 is stopped since the wind speed measured by a wind speed meter 15 is lower than the cut-in wind speed (threshold of wind speed for the generator 3 to start power generation) although the wind turbine rotor 36 is rotating. Further, "singly operated" means that the operating period of one auxiliary motor 6 does not overlap the operating period of another auxiliary motor 6.

The current measurement device 14 is configured to measure a current flowing through the power-supply-side line 10 during execution of the single sequential operation mode by the wind turbine control device 16, based on the output of the CT sensor 13. The current measurement device is configured to acquire a waveform of a three-phase alternating current for driving the auxiliary motors 6 by high-speed sampling. The abnormality diagnosis device 18 is configured to perform abnormality diagnosis of the auxiliary system 4, based on the measurement result of the current measurement device 14. The abnormality diagnosis device 18 is configured to perform abnormality diagnosis of the auxiliary system 4 by applying fast Fourier transform (FFT) to the current measurement data acquired by the current measurement device 14 using the high-speed sampling.

Figure 4:
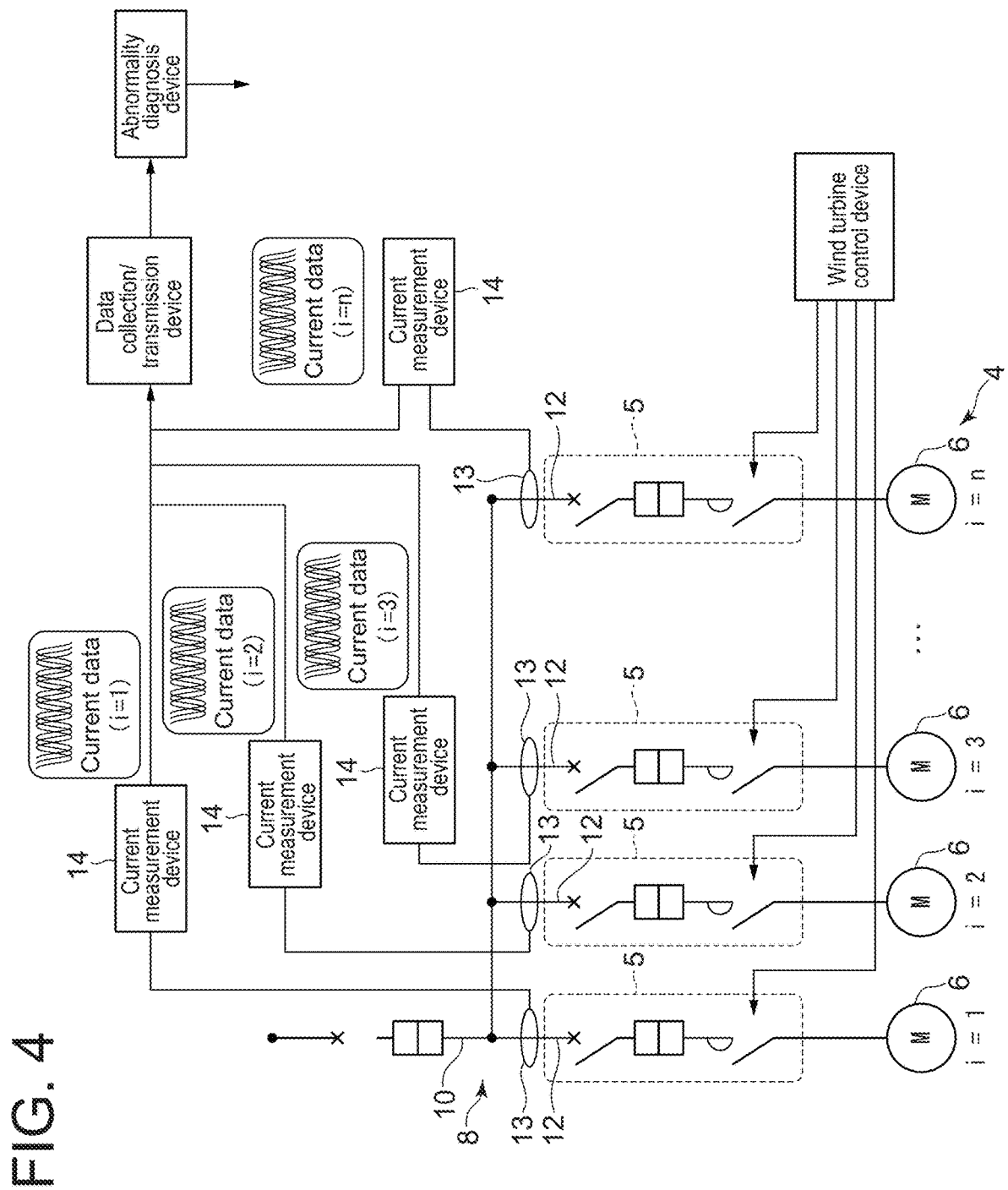
FIG. 4 is a schematic configuration diagram of a condition monitoring device according to a comparative embodiment.

The main effects of the condition monitoring device 2 shown in FIG. 3 will now be described in comparison with a comparative embodiment shown in FIG. 4. FIG. 4 is a schematic configuration diagram of a condition monitoring device according to a comparative embodiment.

According to the configuration shown in FIG. 3, during execution of the single operation mode, the current measurement device 14 measures a current flowing through the power-supply-side line 10, so that the condition of the auxiliary system 4 including the plurality of auxiliary motors 6 can be grasped by a single CT sensor 13 and a single current measurement device 14. Therefore, compared with the case where the CT sensor 13 and the current measurement device 14 are provided for each auxiliary-motor-side line 12 as shown in FIG. 4, it is possible to achieve a low-cost condition monitoring device 2 that can monitor the condition of the auxiliary system 4 of the wind turbine power generating apparatus 100 with a small number of components.

Figure 5:
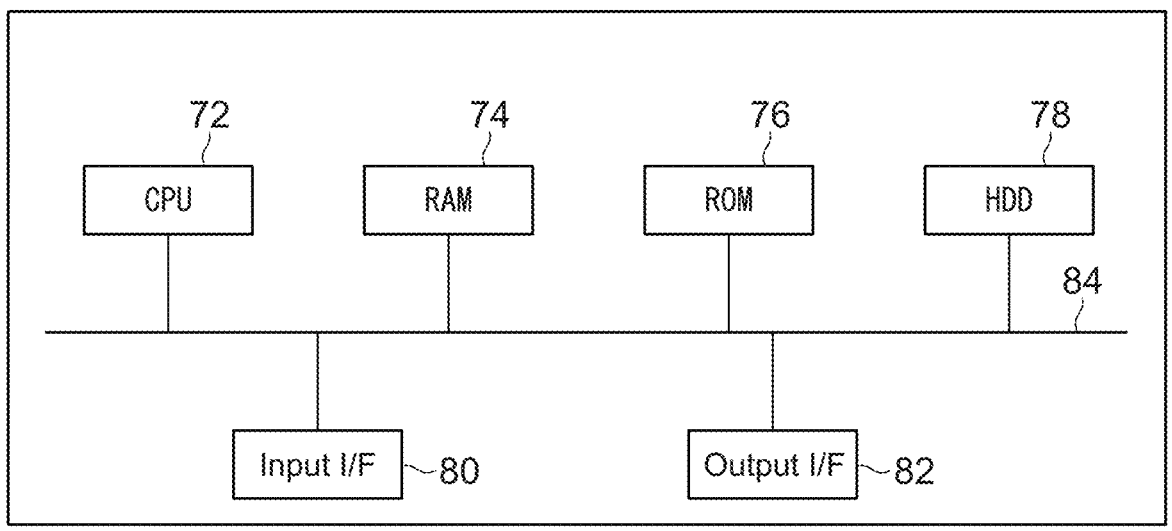
FIG. 5 is a diagram showing an example of a hardware configuration of a current measurement device 14, a wind turbine control device 16, a data collection/transmission device 17, and an abnormality diagnosis device 18.

FIG. 5 is a diagram showing an example of a hardware configuration of the current measurement device 14, the wind turbine control device 16, the data collection/transmission device 17, and the abnormality diagnosis device 18. The hardware configuration shown in FIG. 5 is provided by a computer including a central processing unit (CPU) 72, a random access memory (RAM) 74, a read only memory (ROM) 76, a hard disk drive (HDD) 78, an input I/F 80, and an output I/F 82, which are connected via a bus 84. Each of the current measurement device 14, the wind turbine control device 16, the data collection/transmission device 17, and the abnormality diagnosis device 18 is provided by executing a program that realizes each function by the computer. The function of each configuration described below is realized by, for instance, loading a program stored in the ROM 76 into the RAM 74 and executing the program by the CPU 72, and reading and writing data in the RAM 74 or the ROM 76.

Figure 6:
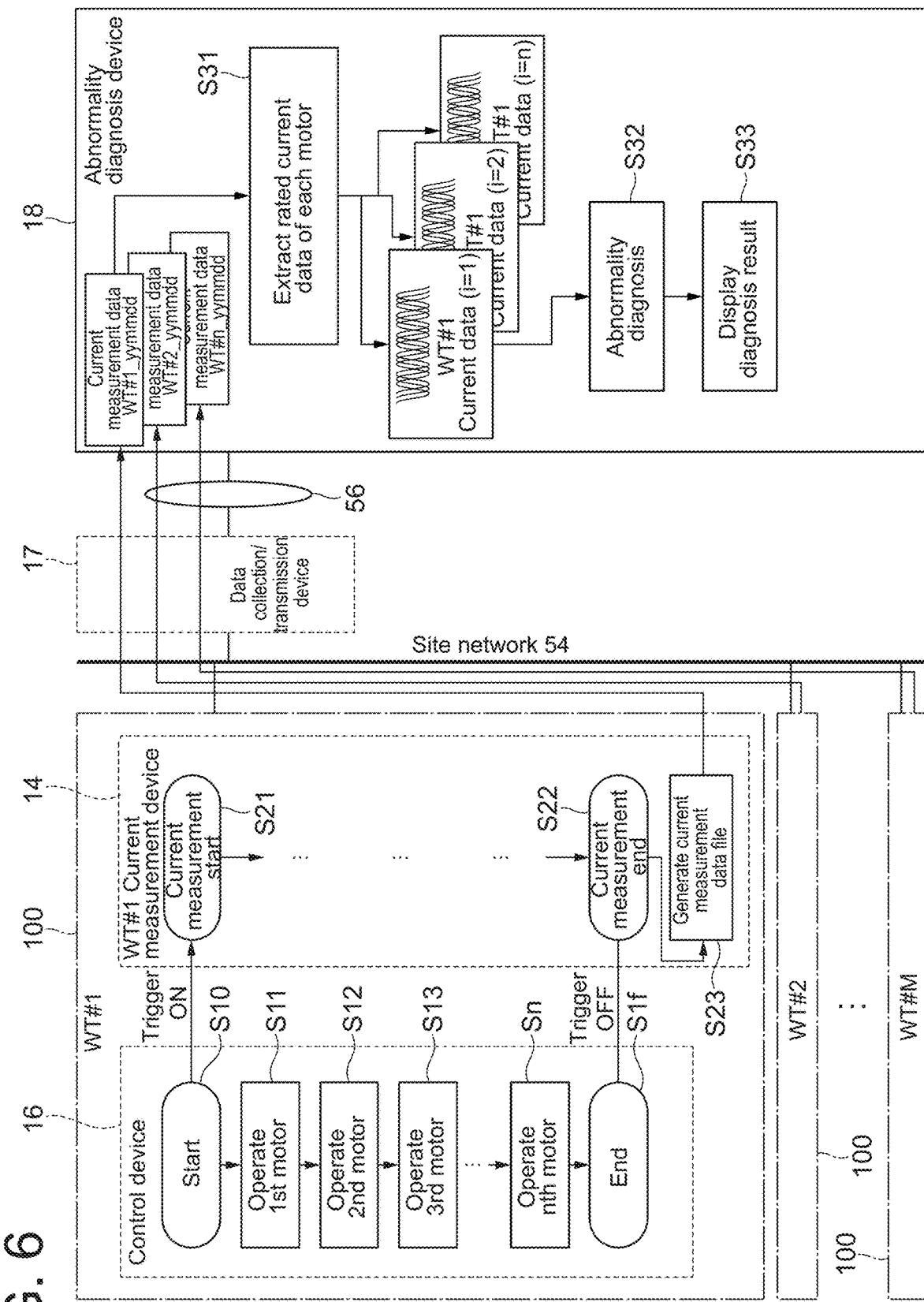
FIG. 6 is a schematic diagram showing an example of operation flowchart of each configuration of the condition monitoring device 2.

FIG. 6 is a schematic diagram showing an example of operation flowchart of each configuration of the condition monitoring device 2.

As shown in FIG. 6, in S10, the wind turbine control device 16 transmits a trigger signal to the current measurement device 14 to start the single sequential operation mode in which each of the auxiliary motors 6 is singly and sequentially operated for a predetermined time. Here, assuming that n is the number of auxiliary motors 6 included in the auxiliary system 4, the wind turbine control device 16 operates the auxiliary motors 6 sequentially and singly for a predetermined time in S11 to S1n. Specifically, the first auxiliary motor 6 is operated alone for a predetermined time in S11, the second auxiliary motor 6 is operated alone for a predetermined time in S12, the third auxiliary motor 6 is operated alone for a predetermined time in S13, and likewise the remaining auxiliary motors 6 are sequentially operated alone for predetermined times up to S1n. Then, the wind turbine control device 16 stops the trigger signal in S1f to end the single sequential operation mode.

Figure 7:
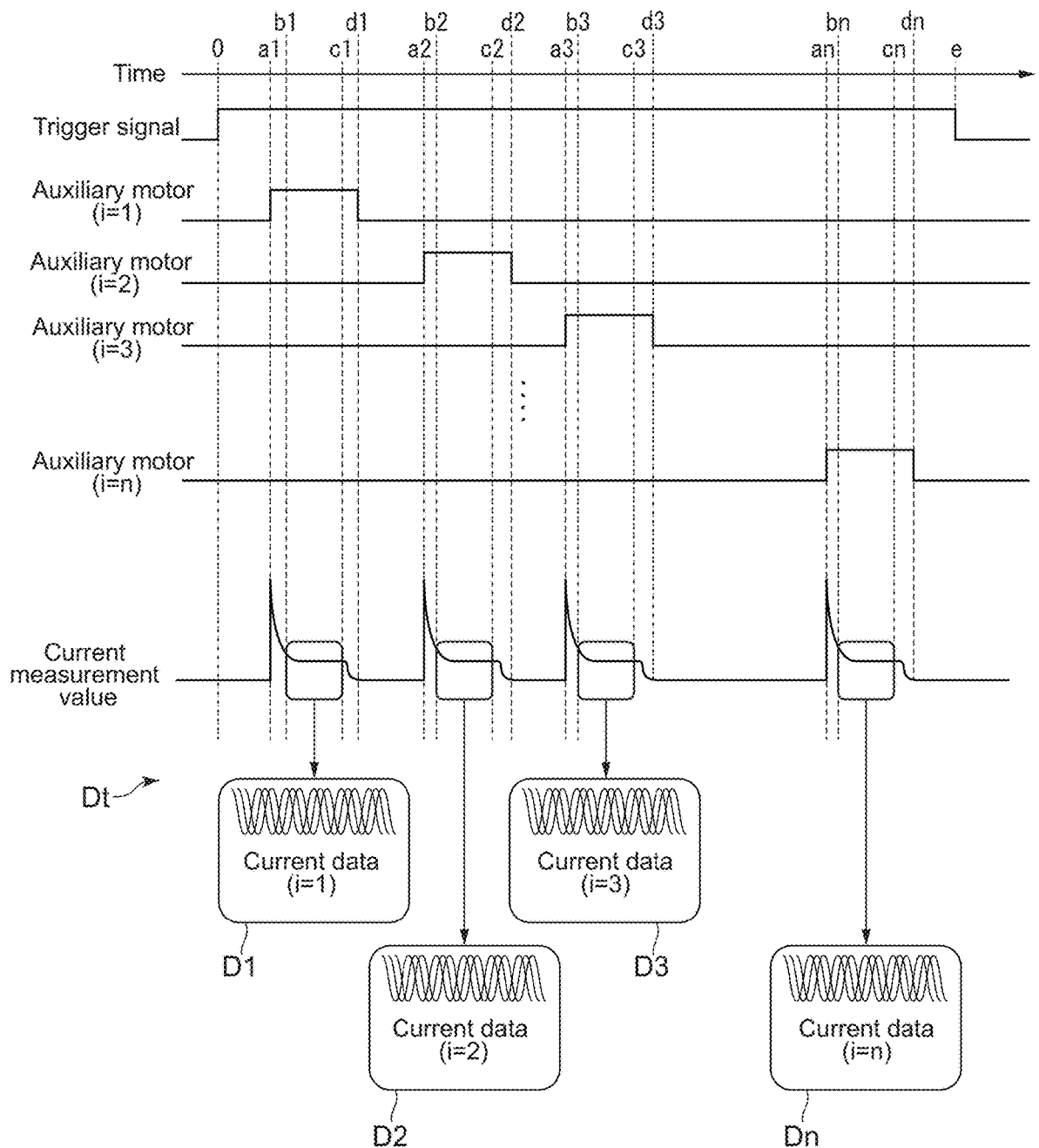
FIG. 7 is a timing chart showing a current measurement value of a power-supply-side line 10 measured by the current measurement device 14 and an operating period of each auxiliary motor in the single sequential operation mode.

FIG. 7 is a timing chart showing a current measurement value of the power-supply-side line 10 measured by the current measurement device 14 and an operating period of each auxiliary motor 6 in the single sequential operation mode. As shown in FIG. 7, the auxiliary motor 6 operated i-thly of the n auxiliary motors 6 in the single sequential operation mode is defined as the i-th auxiliary motor. i is an integer of 1 to n.

As shown in FIG. 7, in the single sequential operation mode, when the start time of the trigger signal is 0, the first auxiliary motor 6 operates from time a1 to time d1. In FIG. 7, time a1 is the timing at which the first auxiliary motor 6 is activated. The period from time a1 to time b1 is an inrush current period corresponding to the inrush current after activation of the first auxiliary motor 6. The period from time b1 to time c1 is a rated current period (second period) during which the rated current is applied to the first auxiliary motor 6. The period from time c1 to time d1 is a current decrease period during which the current flowing in the first auxiliary motor 6 decreases between the rated current period of the first auxiliary motor 6 and time d1 at which the operation of the first auxiliary motor 6 is stopped.

The same applies to the operation of the second and subsequent auxiliary motors 6. Specifically, when the start time of the trigger signal is 0, the i-th auxiliary motor 6 operates from time ai to time di. In FIG. 7, time ai is the timing at which the i-th auxiliary motor 6 is activated. The period from time ai to time bi is an inrush current period corresponding to the inrush current after activation of the i-th auxiliary motor 6. The period from time bi to time ci is a rated current period (second period) during which the rated current is applied to the i-th auxiliary motor 6. The period from time ci to time di is a current decrease period during which the current flowing in the i-th auxiliary motor 6 decreases between the rated current period of the i-th auxiliary motor 6 and time di at which the operation of the i-th auxiliary motor 6 is stopped.

In this way, the wind turbine control device 16 is configured to sequentially and singly operate each of the auxiliary motors 6 at a predetermined timing (time) based on the trigger signal. In other words, the wind turbine control device 16 is configured to sequentially activate and stop each of the auxiliary motors 6 at a predetermined timing based on the trigger signal.

Referring to FIG. 6 again, in S21, the current measurement device 14 starts the measurement of a current flowing through the power-supply-side line 10 in response to receipt of the trigger signal from the wind turbine control device 16. Then, in S22, the current measurement device 14 stops the measurement of a current flowing through the power-supply-side line 10 when the trigger signal transmitted from the wind turbine control device 16 is stopped. That is, as shown in FIG. 7, the current measurement device 14 measures a current flowing through the power-supply-side line 10 based on the output of the CT sensor 13 over a period from the start time 0 of the trigger signal to the stop time e of the trigger signal during execution of the single sequential operation mode.

Further, as shown in S23 of FIG. 6, the measurement result of the current measurement device 14 of each wind turbine power generating apparatus 100 (measurement data indicating the measurement value of a current flowing through the power-supply-side line 10 in the single sequential operation mode) is transmitted to the abnormality diagnosis device 18 via the site network 54, the data collection/transmission device 17, and the Internet VPN 56.

Then, in S31, the abnormality diagnosis device 18 extracts, from the current measurement data of the power-supply-side line 10 measured by the current measurement device 14 during execution of the single sequential operation mode, current measurement data of the power-supply-side line 10 for at least a part of the operating period of each auxiliary motor 6.

The process of S31 will now be described in detail with reference to FIG. 7.

In the example shown in FIG. 7, the abnormality diagnosis device 18 extracts, from the current measurement data Dt of the power-supply-side line 10 measured by the current measurement device 14 during execution of the single sequential operation mode, current measurement data D1 for the rated current period (period from time b1 to time c1) during which the rated current is applied to the first auxiliary motor 6. More specifically, the abnormality diagnosis device 18 extracts, from the current measurement data Dt measured by the current measurement device 14 during execution of the single sequential operation mode, current measurement data D1 for the rated current period (period from time b1 to time c1) during which the rated current is applied to the first auxiliary motor 6, excluding current measurement data for the first period (period from time 0 to time a1) from start of the trigger signal to activation of the first auxiliary motor 6 and current measurement data for the inrush current period (period from a1 to b1) corresponding to the inrush current after activation of the first auxiliary motor.

The same applies to the operation of the second and subsequent auxiliary motors 6. Specifically, the abnormality diagnosis device 18 extracts, from the current measurement data Dt of the power-supply-side line measured by the current measurement device 14 during execution of the single sequential operation mode, current measurement data Di for the rated current period (period from time bi to time ci) during which the rated current is applied to the i-th auxiliary motor 6. More specifically, the abnormality diagnosis device 18 extracts, from the current measurement data Dt measured by the current measurement device 14 during execution of the single sequential operation mode, current measurement data Di for the rated current period (period from time bi to time ci) during which the rated current is applied to the i-th auxiliary motor 6, excluding current measurement data for the first period (period from time 0 to time ai) from start of the trigger signal to activation of the i-th auxiliary motor 6 and current measurement data for the inrush current period (period from ai to bi) corresponding to the inrush current after activation of the i-th auxiliary motor 6. The length of the first period (period from time 0 to time ai) from start of the trigger signal to activation of the i-th auxiliary motor 6 may be, for example, 1 to 5 seconds, and the length of the rated current period (period from time bi to time ci) during which the rated current is applied to the i-th auxiliary motor 6 may be, for example, 2 to 15 seconds.

Then, in S32 shown in FIG. 6, the abnormality diagnosis device 18 performs abnormality diagnosis of the i-th auxiliary motor 6 and a rotary machine (e.g., drive transmission device such as belt or gear of gear box 42, bearing 34, or other rotary machines) connected to the i-th auxiliary motor 6, based on the measurement data Di of the i-th auxiliary motor 6 extracted in S31. The abnormality diagnosis device 18 performs at least one of harmonic analysis, sideband analysis, pattern analysis of transient current values, or distortion analysis on the measurement data Di of the i-th auxiliary motor 6 measured by the current measurement device 14, and performs abnormality diagnosis of the i-th auxiliary motor 6 and the rotary machine connected to the i-th auxiliary motor, based on a feature extracted from the measurement data Di. Then, in S33, the diagnosis result of the abnormality diagnosis device 18 is displayed on a display device (not shown).

As described above, in the single sequential operation mode, since each of the auxiliary motors 6 is sequentially activated at a predetermined timing for each auxiliary motor 6 based on the trigger signal, the current measurement data Di for a period necessary for abnormality diagnosis of the auxiliary system 4 can be extracted based on the trigger signal. Accordingly, with the abnormality diagnosis device 18 configured to perform abnormality diagnosis of the auxiliary motor 6 and the rotary machine connected to the auxiliary motor 6 based on the trigger signal and the current measurement data Dt which is the measurement result of the current measurement device 14, it is possible to perform abnormality diagnosis of the auxiliary system 4 with a low-cost configuration of a small number of components.

Further, in the single sequential operation mode, since abnormality diagnosis of the auxiliary motor 6 and the rotary machine connected to the auxiliary motor 6 is performed based on the current measurement data Di for at least a part of the period excluding the inrush current period, it is possible to accurately perform abnormality diagnosis with a low-cost configuration of a small number of components.

Further, since abnormality diagnosis is performed based on the current measurement data Di for at least a part of the rated current period during which the rated current is applied to the auxiliary motor 6, it is possible to accurately perform abnormality diagnosis with a low-cost configuration of a small number of components.

Other embodiments will now be described.

Figure 8:
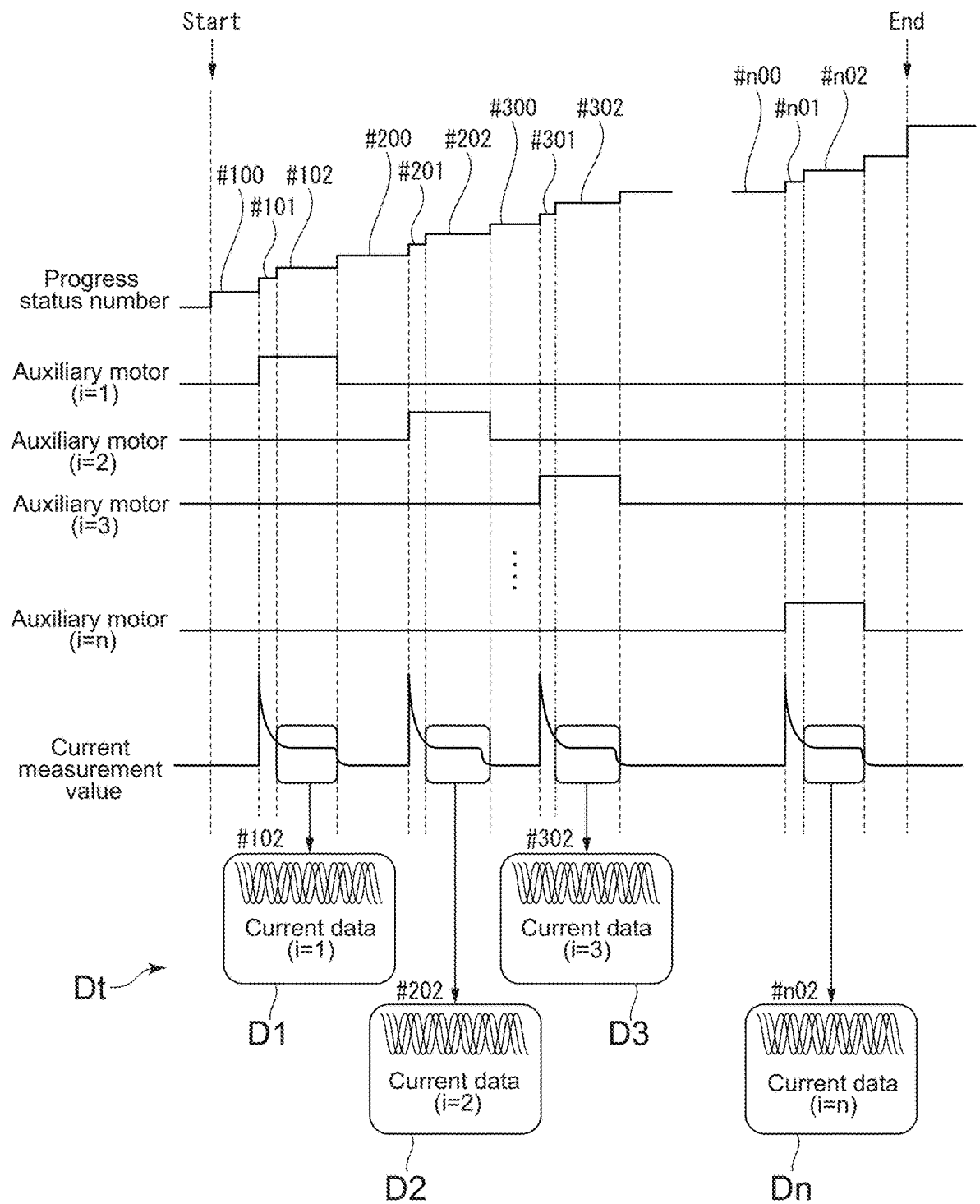
FIG. 8 is a timing chart showing a current measurement value of a power-supply-side line 10 measured by the current measurement device 14 and an operating period of each auxiliary motor in the single sequential operation mode according to another embodiment.

FIG. 8 is a timing chart showing a current measurement value of the power-supply-side line 10 measured by the current measurement device 14 and an operating period of each auxiliary motor in the single sequential operation mode according to another embodiment.

In the embodiment shown in FIG. 8, the wind turbine control device 16 is configured to operate singly and sequentially each of the auxiliary motors 6 in the single sequential operation mode, according to a progress status number indicating the progress status of the single sequential operation mode, and the abnormality diagnosis device 18 is configured to acquire the current measurement data Dt measured by the current measurement device 14 chronologically in association with the progress status number, and perform abnormality diagnosis of the auxiliary system 4, based on the current measurement data Dt and the progress status number.

In FIG. 8, the progress status number 100 indicates the status of the period from start of the single sequential operation mode to activation of the first auxiliary motor 6. The progress status number 101 indicates the status of the inrush current period corresponding to the inrush current after activation of the first auxiliary motor. The progress status number 102 indicates the status of the rated current period during which the rated current is applied to the first auxiliary motor 6.

The same applies to the second and subsequent auxiliary motors 6. Specifically, the progress status number i00 indicates the status of the period from start of the single sequential operation mode to activation of the i-th auxiliary motor 6. The progress status number i01 indicates the status of the inrush current period (third period) corresponding to the inrush current after activation of the i-th auxiliary motor. The progress status number i02 indicates the status of the rated current period during which the rated current is applied to the i-th auxiliary motor 6. The length of the rated current period may be, for example, 2 to 15 seconds.

The abnormality diagnosis device 18 extracts, from the current measurement data Dt of the power-supply-side line measured by the current measurement device 14 during execution of the single sequential operation mode, current measurement data Di for the rated current period during which the rated current is applied to the i-th auxiliary motor 6, based on the progress status number. In the example shown in FIG. 8, the abnormality diagnosis device 18 extracts, from the current measurement data Dt of the power-supply-side line measured by the current measurement device 14 during execution of the single sequential operation mode, current measurement data D1 associated with the progress status number i02.

Then, the abnormality diagnosis device 18 performs abnormality diagnosis of the i-th auxiliary motor 6 and the rotary machine connected to the i-th auxiliary motor, based on the extracted measurement data Di of the i-th auxiliary motor. The abnormality diagnosis device 18 performs at least one of harmonic analysis, sideband analysis, pattern analysis of transient current values, or distortion analysis on the measurement data Di of the i-th auxiliary motor 6 measured by the current measurement device 14, and performs abnormality diagnosis of the i-th auxiliary motor 6 and the rotary machine connected to the i-th auxiliary motor, based on a feature extracted from the measurement data Di.

As described above, in the embodiment shown in FIG. 8, the progress status number includes, for each auxiliary motor 6, a progress status number corresponding to the rated current period during which the rated current is applied to the auxiliary motor 6, and the abnormality diagnosis device 18 is configured to perform, based on the current measurement data Di associated with the progress status number corresponding to the rated current period among the current measurement data Dt measured during execution of the single sequential operation mode, abnormality diagnosis of the auxiliary motor 6 corresponding to the progress status number and the rotary machine connected to the auxiliary motor 6.

In the embodiment shown in FIG. 8, in the single sequential operation mode, since each of the auxiliary motors 6 is sequentially activated according to the progress status number, the current measurement data Di for a period necessary for abnormality diagnosis of the auxiliary system 4 can be extracted based on the progress status number. Accordingly, when abnormality diagnosis of the auxiliary system 4 is performed based on the progress status number and the current measurement data Dt measured by the current measurement device 14, it is possible to perform abnormality diagnosis of the auxiliary system 4 with a low-cost configuration of a small number of components.

The present disclosure is not limited to the embodiments described above, but includes modifications to the embodiments described above, and embodiments composed of combinations of those embodiments.

For example, in the above-described embodiments, the CT sensor 13 (CT current sensor) has been described as the current sensor disposed on the power-supply-side line 10. However, the current sensor disposed on the power-supply-side line 10 is not limited to the CT current sensor. Various current sensors such as a Hall sensor, a Rogoski sensor, and a flux sensor can be used.

Further, in the embodiment shown in FIG. 7, abnormality diagnosis of the i-th auxiliary motor 6 and the rotary machine connected to the i-th auxiliary motor 6 is performed based on the current measurement data Di measured during the rated current period of the i-th auxiliary motor 6 by the current measurement device 14. However, abnormality diagnosis may be performed based on current measurement data measured for at least a part of the rated current period of the i-th auxiliary motor 6. Further, abnormality diagnosis of the i-th auxiliary motor 6 and the rotary machine connected to the i-th auxiliary motor 6 may be performed based on current measurement data for at least a part of the operating period of the i-th auxiliary motor 6 in the single sequential operation mode. In the above-described embodiments, abnormality diagnosis of the auxiliary motor 6 and the rotary machine connected to the auxiliary motor 6 is performed, but only one of the auxiliary motor 6 or the rotary machine may be diagnosed. In other words, the target of abnormality diagnosis of the abnormality diagnosis device 18 may be at least one of the auxiliary motor 6 or the rotary machine connected to the auxiliary motor 6. Further, the target of abnormality diagnosis of the abnormality diagnosis device 18 may be the auxiliary motor power supply system 8 of the auxiliary system 4.

Further, in the above-described embodiments, the single sequential operation mode is executed when the generator 3 is in a standby state where power generation is stopped at a low wind speed. However, it is not always necessary to execute the single sequential operation mode every time the generator 3 is in the standby state where power generation is stopped at a low wind speed. For example, the wind turbine control device 16 may count the number of times the generator 3 is in the standby state where power generation is stopped at a low wind speed, and may execute the single sequential operation mode periodically (for example, when the number of standby times is an integral multiple of a predetermined number), based on the counted number.

The contents described in the above embodiments would be understood as follows, for instance.

(1) A condition monitoring device (e.g., the above-described condition monitoring device 2) for a wind turbine power generating apparatus according to the present disclosure is for monitoring the condition of an auxiliary system (e.g., the above-described auxiliary system 4) of the wind turbine power generating apparatus (e.g., the above-described wind turbine power generating apparatus 100). The auxiliary system includes a plurality of auxiliary motors (e.g., the above-described auxiliary motors 6 (6A to 6F)) and an auxiliary motor power supply system (e.g., the above-described auxiliary motor power supply system 8) for supplying power to the plurality of auxiliary motors. The auxiliary motor power supply system includes a power-supply-side line (e.g., the above-described power-supply-side line 10) connected to a power supply and a plurality of auxiliary-motor-side lines (e.g., the above-described auxiliary-motor-side lines 12) diverging from the power-supply-side line and connected to the plurality of auxiliary motors respectively. The condition monitoring device comprises: a current measurement device (e.g., the above-described current measurement device 14) for measuring a current flowing through the power-supply-side line; and a control device (e.g., the above-described wind turbine control device 16) for controlling the plurality of auxiliary motors. The control device is configured to, when a generator of the wind turbine power generating apparatus is in a standby state where power generation is stopped at a low wind speed, execute a single sequential operation mode in which each of the plurality of auxiliary motors is singly and sequentially operated. The current measurement device is configured to measure a current flowing through the power-supply-side line during execution of the single sequential operation mode by the control device.

According to the condition monitoring device for a wind turbine power generating apparatus described in the above (1), during execution of the single operation mode, the current measurement device measures a current flowing through the power-supply-side line, so that the condition of the auxiliary system including the plurality of auxiliary motors can be grasped based on the measurement result of the single current measurement device. Therefore, compared with the case where the current measurement device is provided for each auxiliary-motor-side line, it is possible to achieve a low-cost condition monitoring device that can monitor the condition of the auxiliary system of the wind turbine power generating apparatus with a small number of components.

(2) In some embodiments, in the condition monitoring device for a wind turbine power generating apparatus described in the above (1), the condition monitoring device further comprises an abnormality diagnosis device (e.g., the above-described abnormality diagnosis device 18) configured to perform abnormality diagnosis of the auxiliary system, based on a measurement result of the current measurement device.

According to the condition monitoring device for a wind turbine power generating apparatus described in the above (2), abnormality diagnosis of the auxiliary system including the plurality of auxiliary motors can be performed based on the measurement result of the single current measurement device. Thus, compared with the case where the current measurement device is provided for each auxiliary-motor-side line, it is possible to reduce the number of components of the condition monitoring device for performing abnormality diagnosis of the auxiliary system. Therefore, it is possible to achieve a low-cost condition monitoring device that can monitor the condition of the auxiliary system of the wind turbine power generating apparatus with a small number of components.

(3) In some embodiments, in the condition monitoring device for a wind turbine power generating apparatus described in the above (2), the control device is configured to sequentially activate each of the auxiliary motors at a predetermined timing based on a trigger signal in the single sequential operation mode. The abnormality diagnosis device is configured to perform abnormality diagnosis of the auxiliary system, based on the measurement result of the current measurement device and the trigger signal.

According to the condition monitoring device for a wind turbine power generating apparatus described in the above (3), in the single sequential operation mode, since each of the auxiliary motors is sequentially activated at a predetermined timing for each auxiliary motor based on the trigger signal, the current measurement data for a period necessary for abnormality diagnosis of the auxiliary system can be extracted based on the trigger signal. Therefore, with the abnormality diagnosis device configured to perform abnormality diagnosis of the auxiliary system based on the trigger signal and the current measurement of the current measurement device, it is possible to achieve a low-cost condition monitoring device that can monitor the condition of the auxiliary system of the wind turbine power generating apparatus with a small number of components.

(4) In some embodiments, in the condition monitoring device for a wind turbine power generating apparatus described in the above (3), the plurality of auxiliary motors includes n auxiliary motors, and when an auxiliary motor operated i-thly of the n auxiliary motors in the single sequential operation mode is defined as an i-th auxiliary motor, the abnormality diagnosis device is configured to: extract, from data of the current measured by the current measurement device during execution of the single sequential operation mode, data of the current for a second period which is at least a part of an operating period of the i-th auxiliary motor, excluding data of the current for a first period which is a period from start of the trigger signal to activation of the i-th auxiliary motor; and perform abnormality diagnosis of at least one of the i-th auxiliary motor or a rotary machine connected to the i-th auxiliary motor, based on the data of the current for the second period.

According to the condition monitoring device for a wind turbine power generating apparatus described in the above (4), abnormality diagnosis of at least one of the auxiliary motor or the rotary machine connected to the auxiliary motor can be performed with a low-cost configuration of a small number of components.

(5) In some embodiments, in the condition monitoring device for a wind turbine power generating apparatus described in the above (4), the second period is at least a part of the operating period of the i-th auxiliary motor, excluding an inrush current period corresponding to an inrush current after activation of the i-th auxiliary motor.

According to the condition monitoring device for a wind turbine power generating apparatus described in the above (5), since abnormality diagnosis is performed based on the current measurement data for at least a part of the period excluding the inrush current period, it is possible to accurately perform abnormality diagnosis of the auxiliary system with a low-cost configuration of a small number of components.

(6) In some embodiments, in the condition monitoring device for a wind turbine power generating apparatus described in the above (4) or (5), the second period is at least a part of a period during which a rated current is applied to the i-th auxiliary motor, among the operating period of the i-th auxiliary motor.

According to the condition monitoring device for a wind turbine power generating apparatus described in the above (6), since abnormality diagnosis is performed based on the current measurement data for at least a part of the period during which the rated current is applied to the auxiliary motor, it is possible to accurately perform abnormality diagnosis of the auxiliary system with a low-cost configuration of a small number of components.

(7) In some embodiments, in the condition monitoring device for a wind turbine power generating apparatus described in any one of the above (4) to (6), the first period is 1 to 5 seconds, and the second period is 2 to 15 seconds.

According to the condition monitoring device for a wind turbine power generating apparatus described in the above (7), abnormality diagnosis of at least one of the n auxiliary motors or the rotary machine connected to the auxiliary motors can be performed with a low-cost configuration of a small number of components.

(8) In some embodiments, in the condition monitoring device for a wind turbine power generating apparatus described in the above (2), the control device is configured to activate each of the plurality of auxiliary motors in the single sequential operation mode according to a progress status number indicating a progress status of the single sequential operation mode. The abnormality diagnosis device is configured to acquire data of the current measured by the current measurement device chronologically in association with the progress status number, and perform abnormality diagnosis of the auxiliary system, based on the data of the current and the progress status number.

According to the condition monitoring device for a wind turbine power generating apparatus described in the above (8), in the single sequential operation mode, since each of the auxiliary motors is sequentially activated according to the progress status number, the current data for a period necessary for abnormality diagnosis of the auxiliary system can be identified based on the progress status number. Accordingly, with the abnormality diagnosis device configured to perform abnormality diagnosis of the auxiliary system based on the progress status number and the current data measured by the current measurement device, it is possible to perform abnormality diagnosis of the auxiliary system with a low-cost configuration of a small number of components.

(9) In some embodiments, in the condition monitoring device for a wind turbine power generating apparatus described in the above (8), the progress status number includes, for each auxiliary motor, a progress status number corresponding to a third period which is at least a part of a period during which a rated current is applied to the auxiliary motor. The abnormality diagnosis device is configured to perform, based on data of the current associated with the progress status number corresponding to the third period among the data of the current measured by the current measurement device during execution of the single sequential operation mode, abnormality diagnosis of at least one of the auxiliary motor corresponding to the progress status number or a rotary machine connected to the auxiliary motor.

According to the condition monitoring device for a wind turbine power generating apparatus described in the above (9), abnormality diagnosis of at least one of the auxiliary motor or the rotary machine connected to the auxiliary motor can be performed with a low-cost configuration of a small number of components.

(10) In some embodiments, in the condition monitoring device for a wind turbine power generating apparatus described in the above (9), the third period is 2 to 15 seconds.

According to the condition monitoring device for a wind turbine power generating apparatus described in the above (10), abnormality diagnosis of at least one of the auxiliary motor or the rotary machine connected to the auxiliary motor can be performed with a low-cost configuration of a small number of components.

(11) In some embodiments, in the condition monitoring device for a wind turbine power generating apparatus described in any one of the above (1) to (10), the plurality of auxiliary motors includes at least one of a fan motor (e.g., the above-described cooling fan motors 6A, 6F), a pump motor (e.g., the above-described lubricating oil pump motor 6B and control oil pump motor 6C), a yaw motor (e.g., the above-described yaw motor 6E) for adjusting a yaw angle, or a pitch motor (e.g., the above-described pitch motor 6D) for adjusting a pitch angle.

According to the condition monitoring device for a wind turbine power generating apparatus described in the above (11), abnormality diagnosis of at least one of the fan motor, the pump motor, the yaw motor for adjusting the yaw angle, or the pitch motor for adjusting the pitch angle can be performed with a low-cost configuration of a small number of components.

(12) In some embodiments, in the condition monitoring device for a wind turbine power generating apparatus described in any one of the above (1) to (11), the abnormality diagnosis device is configured to perform at least one of harmonic analysis, sideband analysis, pattern analysis of transient current values, or distortion analysis on data of the current measured by the current measurement device, and perform abnormality diagnosis of the auxiliary system, based on a feature extracted from the data of the current.

According to the condition monitoring device for a wind turbine power generating apparatus described in the above (12), it is possible to accurately perform abnormality diagnosis of the auxiliary system with a low-cost configuration of a small number of components.

(13) In some embodiments, in the condition monitoring device for a wind turbine power generating apparatus described in any one of the above (1) to (12), the current measurement device is configured to acquire a waveform of a three-phase alternating current for driving the auxiliary motors by high-speed sampling. The abnormality diagnosis device is configured to perform abnormality diagnosis of the auxiliary system by applying FFT to data of the current acquired by the high-speed sampling.

According to the condition monitoring device for a wind turbine power generating apparatus described in the above (13), it is possible to perform abnormality diagnosis of the auxiliary system with a low-cost configuration of a small number of components.

(14) A condition monitoring method for a wind turbine power generating apparatus according to at least one embodiment of the present disclosure is for monitoring the condition of an auxiliary system (e.g., the above-described auxiliary system 4) of the wind turbine power generating apparatus (e.g., the above-described wind turbine power generating apparatus 100). The auxiliary system includes a plurality of auxiliary motors (e.g., the above-described auxiliary motors 6 (6A to 6F)) and an auxiliary motor power supply system (e.g., the above-described auxiliary motor power supply system 8) for supplying power to the plurality of auxiliary motors. The auxiliary motor power supply system includes a power-supply-side line (e.g., the above-described power-supply-side line 10) connected to a power supply and a plurality of auxiliary-motor-side lines (e.g., the above-described auxiliary-motor-side lines 12) diverging from the power-supply-side line and connected to the plurality of auxiliary motors respectively. The condition monitoring method comprises: a step of, when a generator of the wind turbine power generating apparatus is in a standby state where power generation is stopped at a low wind speed, executing a single sequential operation mode in which each of the plurality of auxiliary motors is singly and sequentially operated; and a step of measuring a current flowing through the power-supply-side line during execution of the single sequential operation mode.

According to the condition monitoring method for a wind turbine power generating apparatus described in the above (14), during execution of the single operation mode, the current measurement device measures a current flowing through the power-supply-side line, so that the condition of the auxiliary system including the plurality of auxiliary motors can be grasped based on the measurement result of the single current measurement device. Therefore, compared with the case where the current measurement device is provided for each auxiliary-motor-side line, it is possible to monitor the condition of the auxiliary system of the wind turbine power generating apparatus with a small number of components.

The invention claimed is:

1. A condition monitoring device for a wind turbine power generating apparatus for monitoring a condition of an auxiliary system of the wind turbine power generating apparatus,
   the auxiliary system including a plurality of auxiliary motors and an auxiliary motor power supply system for supplying power to the plurality of auxiliary motors,
   the auxiliary motor power supply system including a power-supply-side line connected to a power supply, and a plurality of auxiliary-motor-side lines diverging from the power-supply-side line and connected to the plurality of auxiliary motors, respectively,
   the condition monitoring device comprising:
      a current sensor disposed on the power-supply-side line;
      a current measurement device for measuring a current flowing through the power-supply-side line based on an output of the current sensor; and
      a control device for controlling the plurality of auxiliary motors,
   wherein the control device is configured to, when a generator of the wind turbine power generating apparatus is in a standby state where power generation is stopped at a low wind speed, execute a single sequential operation mode in which each of the plurality of auxiliary motors is singly and sequentially operated, and
   wherein the current measurement device is configured to measure a current flowing through the power-supply-side line during execution of the single sequential operation mode by the control device.

2. The condition monitoring device according to claim 1, further comprising an abnormality diagnosis device configured to perform abnormality diagnosis of the auxiliary system, based on a measurement result of the current measurement device.

3. The condition monitoring device according to claim 2,
   wherein the control device is configured to sequentially activate each of the auxiliary motors at a predetermined timing based on a trigger signal in the single sequential operation mode, and
   wherein the abnormality diagnosis device is configured to perform abnormality diagnosis of the auxiliary system, based on the trigger signal and the measurement result of the current measurement device.

4. The condition monitoring device according to claim 3,
   wherein the plurality of auxiliary motors includes n auxiliary motors, and
   wherein when an auxiliary motor operated i-thly of the n auxiliary motors in the single sequential operation mode is defined as an i-th auxiliary motor,
   the abnormality diagnosis device is configured to:
      extract, from data of the current measured by the current measurement device during execution of the single sequential operation mode, data of the current for a second period which is at least a part of an operating period of the i-th auxiliary motor, excluding data of the current for a first period which is a period from start of the trigger signal to activation of the i-th auxiliary motor; and
      perform abnormality diagnosis of at least one of the i-th auxiliary motor or a rotary machine connected to the i-th auxiliary motor, based on the data of the current for the second period.

5. The condition monitoring device according to claim 4, wherein the second period is at least a part of the operating period of the i-th auxiliary motor, excluding an inrush current period corresponding to an inrush current after activation of the i-th auxiliary motor.

6. The condition monitoring device according to claim 4, wherein the second period is at least a part of a period during which a rated current is applied to the i-th auxiliary motor, among the operating period of the i-th auxiliary motor.

7. The condition monitoring device according to claim 4, wherein the first period is 1 to 5 seconds, and the second period is 2 to 15 seconds.

8. The condition monitoring device according to claim 2,
   wherein the control device is configured to operate each of the plurality of auxiliary motors in the single sequential operation mode according to a progress status number indicating a progress status of the single sequential operation mode, and
   wherein the abnormality diagnosis device is configured to acquire data of the current measured by the current measurement device chronologically in association with the progress status number, and perform abnormality diagnosis of the auxiliary system, based on the data of the current and the progress status number.

9. The condition monitoring device according to claim 8,
   wherein the progress status number includes, for each auxiliary motor, a progress status number corresponding to a third period which is at least a part of a period during which a rated current is applied to the auxiliary motor, and
   wherein the abnormality diagnosis device is configured to perform, based on data of the current associated with the progress status number corresponding to the third period among the data of the current measured by the current measurement device during execution of the single sequential operation mode, abnormality diagnosis of at least one of the auxiliary motor corresponding to the progress status number or a rotary machine connected to the auxiliary motor.

10. The condition monitoring device according to claim 9, wherein the third period is 2 to 15 seconds.

11. The condition monitoring device according to claim 1, wherein the plurality of auxiliary motors includes at least one of a fan motor, a pump motor, a yaw motor for adjusting a yaw angle, or a pitch motor for adjusting a pitch angle included in the wind turbine power generating apparatus.

12. The condition monitoring device according to claim 1, wherein the abnormality diagnosis device is configured to perform at least one of harmonic analysis, sideband analysis, pattern analysis of transient current values, or distortion analysis on data of the current measured by the current measurement device, and perform abnormality diagnosis of the auxiliary system, based on a feature extracted from the data of the current.

13. The condition monitoring device according to claim 1, wherein the current measurement device is configured to acquire a waveform of a three-phase alternating current for driving the auxiliary motors by high-speed sampling, and
wherein the abnormality diagnosis device is configured to perform abnormality diagnosis of the auxiliary system by applying FFT to data of the current acquired by the high-speed sampling.

14. A condition monitoring method for a condition monitoring device for a wind turbine power generating apparatus for monitoring a condition of an auxiliary system of the wind turbine power generating apparatus,
the auxiliary system including a plurality of auxiliary motors and an auxiliary motor power supply system for supplying power to the plurality of auxiliary motors,
the auxiliary motor power supply system including a power-supply-side line connected to a power supply, and a plurality of auxiliary-motor-side lines diverging from the power-supply-side line and connected to the plurality of auxiliary motors, respectively,
the condition monitoring device comprising:
a current sensor disposed on the power-supply-side line;
a current measurement device for measuring a current flowing through the power-supply-side line based on an output of the current sensor; and
a control device for controlling the plurality of auxiliary motors,
the condition monitoring method comprising:
a step of, when a generator of the wind turbine power generating apparatus is in a standby state where power generation is stopped at a low wind speed, executing a single sequential operation mode in which each of the plurality of auxiliary motors is singly and sequentially operated; and
a step of measuring a current flowing through the power-supply-side line during execution of the single sequential operation mode.

15. A condition monitoring device for a wind turbine power generating apparatus for monitoring a condition of an auxiliary system of the wind turbine power generating apparatus,
the auxiliary system including a plurality of auxiliary motors and an auxiliary motor power supply system for supplying power to the plurality of auxiliary motors,
the auxiliary motor power supply system including a power-supply-side line connected to a power supply, and a plurality of auxiliary-motor-side lines diverging from the power-supply-side line and connected to the plurality of auxiliary motors, respectively,
the condition monitoring device comprising:
a current measurement device for measuring a current flowing through the power-supply-side line; and
a control device for controlling the plurality of auxiliary motors,
wherein the control device is configured to, when a generator of the wind turbine power generating apparatus is in a standby state where power generation is stopped at a low wind speed, execute a single sequential operation mode in which each of the plurality of auxiliary motors is singly and sequentially operated,
wherein the current measurement device is configured to measure a current flowing through the power-supply-side line during execution of the single sequential operation mode by the control device,
wherein the condition monitoring device further comprises an abnormality diagnosis device configured to perform abnormality diagnosis of the auxiliary system, based on a measurement result of the current measurement device,
wherein the control device is configured to sequentially activate each of the auxiliary motors at a predetermined timing based on a trigger signal in the single sequential operation mode,
wherein the abnormality diagnosis device is configured to perform abnormality diagnosis of the auxiliary system, based on the trigger signal and the measurement result of the current measurement device,
wherein the plurality of auxiliary motors includes n auxiliary motors, and
wherein when an auxiliary motor operated i-thly of the n auxiliary motors in the single sequential operation mode is defined as an i-th auxiliary motor,
the abnormality diagnosis device is configured to:
extract, from data of the current measured by the current measurement device during execution of the single sequential operation mode, data of the current for a second period which is at least a part of an operating period of the i-th auxiliary motor, excluding data of the current for a first period which is a period from start of the trigger signal to activation of the i-th auxiliary motor; and
perform abnormality diagnosis of at least one of the i-th auxiliary motor or a rotary machine connected to the i-th auxiliary motor, based on the data of the current for the second period.

16. A condition monitoring device for a wind turbine power generating apparatus for monitoring a condition of an auxiliary system of the wind turbine power generating apparatus,
the auxiliary system including a plurality of auxiliary motors and an auxiliary motor power supply system for supplying power to the plurality of auxiliary motors,
the auxiliary motor power supply system including a power-supply-side line connected to a power supply, and a plurality of auxiliary-motor-side lines diverging from the power-supply-side line and connected to the plurality of auxiliary motors, respectively,
the condition monitoring device comprising:
a current measurement device for measuring a current flowing through the power-supply-side line; and
a control device for controlling the plurality of auxiliary motors,
wherein the control device is configured to, when a generator of the wind turbine power generating apparatus is in a standby state where power generation is stopped at a low wind speed, execute a single sequential operation mode in which each of the plurality of auxiliary motors is singly and sequentially operated,
wherein the current measurement device is configured to measure a current flowing through the power-supply-side line during execution of the single sequential operation mode by the control device,
wherein the condition monitoring device further comprises an abnormality diagnosis device configured to perform abnormality diagnosis of the auxiliary system, based on a measurement result of the current measurement device, wherein the control device is configured to operate each of the plurality of auxiliary motors in the single sequential operation mode according to a progress status number indicating a progress status of the single sequential operation mode, wherein the abnormality diagnosis device is configured to acquire data of the current measured by the current measurement device chronologically in association with the progress status number, and perform abnormality diagnosis of the auxiliary system, based on the data of the current and the progress status number, wherein the progress status number includes, for each auxiliary motor, a progress status number corresponding to a third period which is at least a part of a period during which a rated current is applied to the auxiliary motor, and wherein the abnormality diagnosis device is configured to perform, based on data of the current associated with the progress status number corresponding to the third period among the data of the current measured by the current measurement device during execution of the single sequential operation mode, abnormality diagnosis of at least one of the auxiliary motor corresponding to the progress status number or a rotary machine connected to the auxiliary motor.

* * * * *